(12) United States Patent  
Maehara

(10) Patent No.: US 10,910,289 B2
(45) Date of Patent: Feb. 2, 2021

(54) ELECTRONIC SUBSTRATE AND ELECTRONIC APPARATUS

(71) Applicant: SONY SEMICONDUCTOR SOLUTIONS CORPORATION, Kanagawa (JP)

(72) Inventor: Masataka Maehara, Tokyo (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/330,963

(22) PCT Filed: Oct. 20, 2017

(86) PCT No.: PCT/JP2017/037968
§ 371 (c)(1),
(2) Date: Mar. 6, 2019

(87) PCT Pub. No.: WO2018/074581
PCT Pub. Date: Apr. 26, 2018

(65) Prior Publication Data
US 2019/0259633 A1 Aug. 22, 2019

(30) Foreign Application Priority Data

Oct. 21, 2016 (JP) ................................ 2016-206876

(51) Int. Cl.
*H01L 23/31* (2006.01)
*H01L 21/56* (2006.01)
(Continued)

(52) U.S. Cl.
CPC ........ *H01L 23/3157* (2013.01); *H01L 21/563* (2013.01); *H01L 24/05* (2013.01);
(Continued)

(58) Field of Classification Search
CPC ... H01L 21/563; H01L 23/3157; H01L 24/16; H01L 24/26; H01L 24/32;
(Continued)

(56) References Cited

U.S. PATENT DOCUMENTS 7,883,937 B1* 2/2011 Kang .................... H01L 21/563
257/687
8,441,123 B1* 5/2013 Lee ........................ H01L 21/563
257/737
(Continued)

FOREIGN PATENT DOCUMENTS

CN 101578695 A 11/2009
CN 103824819 A 5/2014
(Continued)

OTHER PUBLICATIONS

International Search Report and Written Opinion of PCT Application No. PCT/JP2017/037968, dated Nov. 28, 2017, 10 pages of ISRWO.

*Primary Examiner* — Stephen W Smoot
(74) *Attorney, Agent, or Firm* — Chip Law Group

(57) ABSTRACT

The present technology relates to an electronic substrate that achieves a reduction in the size of a substrate and enables a void risk in an underfill to be reduced, and an electronic apparatus. An electronic substrate in one aspect of the present technology includes: an electronic chip that is placed above a substrate; an electrode that exists between the substrate and the electronic chip and electrically connects the substrate and the electronic chip; an underfill with which a space between the substrate and the electronic chip is filled so that the electrode is sealed and protected; a protection target to be protected from inflow of the underfill, the protection target being formed on the substrate; and an underfill inflow prevention unit that is formed in the substrate so as to surround an entirety or a portion of the
(Continued)

protection target. The present technology is applicable to, for example, a solid-state image sensor.

15 Claims, 14 Drawing Sheets

(51) Int. Cl.
*H01L 23/00* (2006.01)
*H01L 27/146* (2006.01)
*H01L 27/14* (2006.01)
*H01L 25/065* (2006.01)
*H01L 23/13* (2006.01)
*H01L 25/10* (2006.01)

(52) U.S. Cl.
CPC .............. *H01L 24/16* (2013.01); *H01L 24/32* (2013.01); *H01L 27/14* (2013.01); *H01L 27/14601* (2013.01); *H01L 27/14618* (2013.01); *H01L 27/14625* (2013.01); *H01L 23/13* (2013.01); *H01L 24/73* (2013.01); *H01L 24/83* (2013.01); *H01L 25/0655* (2013.01); *H01L 25/105* (2013.01); *H01L 2224/02245* (2013.01); *H01L 2224/16225* (2013.01); *H01L 2224/26175* (2013.01); *H01L 2224/27013* (2013.01); *H01L 2224/3201* (2013.01); *H01L 2224/32225* (2013.01); *H01L 2224/73204* (2013.01); *H01L 2224/83855* (2013.01); *H01L 2224/92125* (2013.01); *H01L 2225/1023* (2013.01); *H01L 2225/1058* (2013.01); *H01L 2924/00014* (2013.01); *H01L 2924/15311* (2013.01); *H01L 2924/18301* (2013.01); *H01L 2924/19107* (2013.01)

(58) Field of Classification Search
CPC ......... H01L 27/14625; H01L 27/14636; H01L 31/0203; H01L 2224/16225; H01L 2224/26145; H01L 2224/32225; H01L 2924/18161; H01L 2924/18301
See application file for complete search history.

(56) References Cited

U.S. PATENT DOCUMENTS

| | | | |
|---|---|---|---|
| 9,093,393 B2 | 7/2015 | Suda | |
| 2008/0237895 A1 | 10/2008 | Saeki | |
| 2010/0025847 A1 | 2/2010 | Tomura et al. | |
| 2011/0074015 A1* | 3/2011 | Suzuki | H01L 23/3142 257/737 |
| 2011/0115083 A1* | 5/2011 | Zang | H01L 21/563 257/738 |
| 2011/0279717 A1* | 11/2011 | Wakiyama | H01L 27/14609 348/294 |
| 2014/0138852 A1* | 5/2014 | Suda | H01L 24/05 257/777 |
| 2016/0315028 A1* | 10/2016 | Chou | H01L 24/81 |
| 2017/0179049 A1* | 6/2017 | Koch | H01L 21/563 |
| 2017/0194226 A1* | 7/2017 | Chen | H01L 23/5226 |
| 2017/0256577 A1 | 9/2017 | Inoue et al. | |

FOREIGN PATENT DOCUMENTS

| | | |
|---|---|---|
| CN | 106796941 A | 5/2017 |
| CN | 107112341 A | 8/2017 |
| EP | 2733729 A2 | 5/2014 |
| JP | 11-145183 A | 5/1999 |
| JP | 2003-234362 A | 8/2003 |
| JP | 2006-140327 A | 6/2006 |
| JP | 2006-294986 A | 10/2006 |
| JP | 2008-252026 A | 10/2008 |
| JP | 2009-177061 A | 8/2009 |
| JP | 2010-087239 A | 4/2010 |
| JP | 2014-103198 A | 6/2014 |
| JP | 2016-163011 A | 9/2016 |
| KR | 10-2014-0064618 A | 5/2014 |
| KR | 10-2017-0057229 A | 5/2017 |
| TW | 201421644 A | 6/2014 |
| TW | 201611255 A | 3/2016 |
| WO | 2008/078746 A1 | 7/2008 |
| WO | 2015/056430 A1 | 4/2015 |
| WO | 2015/1056430 A1 | 4/2015 |
| WO | 2016/039173 A1 | 3/2016 |
| WO | 2016/139914 A1 | 9/2016 |

* cited by examiner

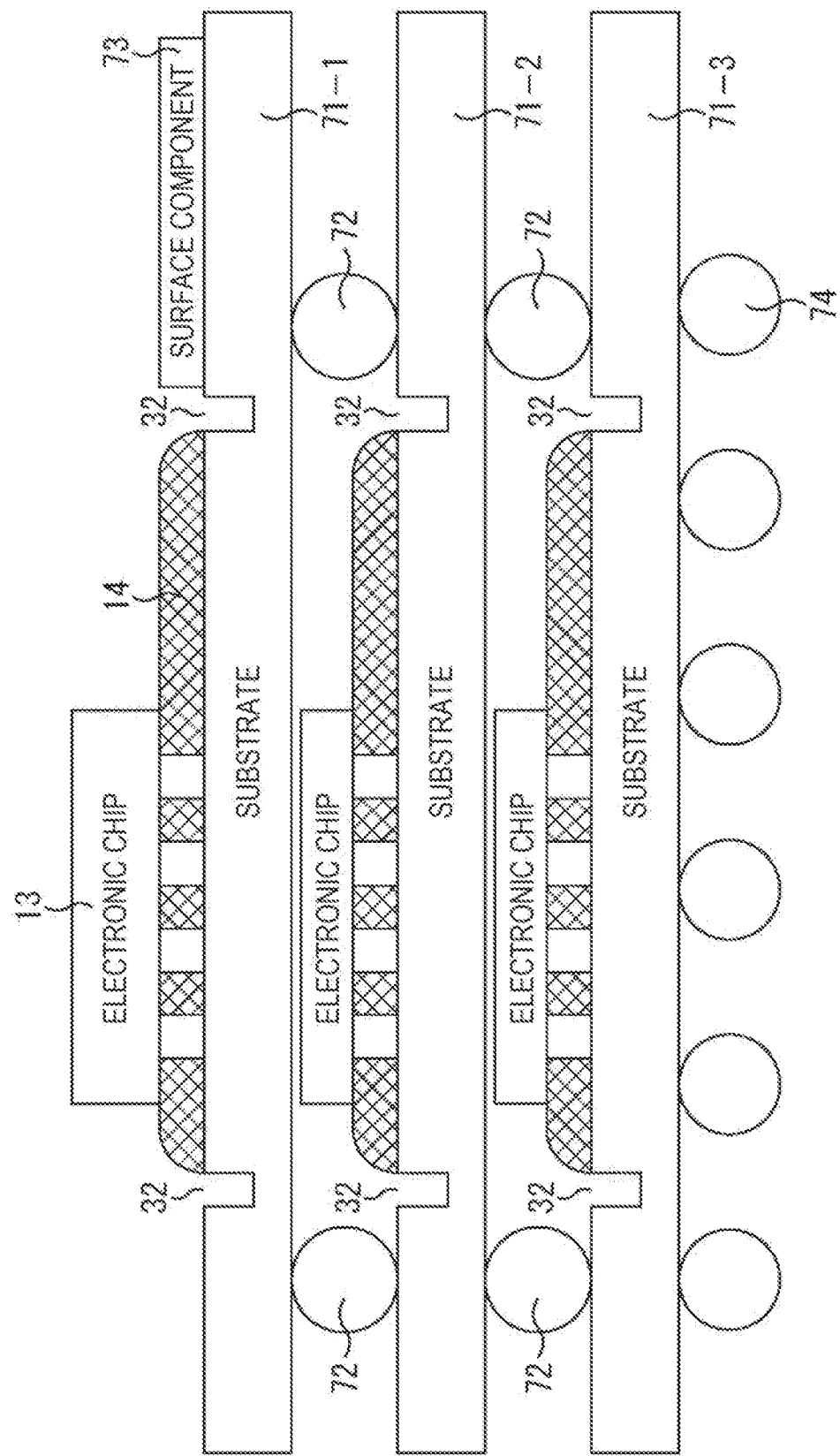

ELECTRONIC SUBSTRATE AND ELECTRONIC APPARATUS

CROSS REFERENCE TO RELATED APPLICATIONS

This application is a U.S. National Phase of International Patent Application No. PCT/JP2017/037968 filed on Oct. 20, 2017, which claims priority benefit of Japanese Patent Application No. JP 2016-206876 filed in the Japan Patent Office on Oct. 21, 2016. Each of the above-referenced applications is hereby incorporated herein by reference in its entirety.

TECHNICAL FIELD

The present technology relates to an electronic substrate and an electronic apparatus, and in particular, to an electronic substrate and an electronic apparatus, in which a prescribed electronic chip is mounted above a substrate and a space between the substrate and the electronic chip is filled with an underfill (liquid curable resin) so that an electrode between the substrate and the electronic chip is sealed and protected.

BACKGROUND ART

Conventionally, there is a technology in which a prescribed electronic chip is placed above a substrate that configures an electronic apparatus and a space between the substrate and the electronic chip is filled with an underfill so that an electrode between the substrate and the electronic chip is sealed and protected.

Furthermore, a technology for forming a groove on a substrate has been proposed as a structure that prevents a filled underfill from unnecessarily spreading (see, for example, Patent Document 1).

CITATION LIST

Patent Document

Patent Document 1: Japanese Patent Application Laid-Open No. 2010-87239

SUMMARY OF THE INVENTION

Problems to be Solved by the Invention

Meanwhile, in the technology proposed in Patent Document 1, a configuration is employed in which a groove that prevents an underfill from unnecessarily spreading is formed in the shape of a frame that surrounds a chip and the area of the chip is secured so as to increase by the area of the groove.

The present technology has been made in view of the situation above, and the present technology realizes a reduction in the size of a substrate, and also enables a void risk in an underfill to be reduced.

Solutions to Problems

An electronic substrate in a first aspect of the present technology includes: an electronic chip that is placed above a substrate; an electrode that exists between the substrate and the electronic chip and electrically connects the substrate and the electronic chip; an underfill with which a space between the substrate and the electronic chip is filled so that the electrode is sealed and protected; a protection target to be protected from inflow of the underfill, the protection target being formed on the substrate; and an underfill inflow prevention unit that is formed in the substrate so as to surround an entirety or a portion of the protection target.

The underfill inflow prevention unit can have a multiple structure.

The underfill inflow prevention unit can be a recessed groove.

The recessed groove can have an inclination angle of 60° to 90° with respect to a surface of the substrate.

A depth/width of the recessed groove can range from 0.5 to 16000.

The underfill inflow prevention unit can be a protruding wall.

The protection target can be a connection pad that is connected to external equipment.

The protection target can be a light-receiving layer, the electronic chip can be a semiconductor chip including a functional circuit, and the electronic substrate can be a component of a solid-state image sensor.

The underfill inflow prevention unit can be formed in the substrate so as to surround all or some of one or a plurality of the protection targets.

An electronic apparatus in a second aspect of the present technology is an electronic apparatus in which an electronic substrate is employed. The electronic substrate includes: an electronic chip that is placed above a substrate; an electrode that exists between the substrate and the electronic chip and electrically connects the substrate and the electronic chip; an underfill with which a space between the substrate and the electronic chip is filled so that the electrode is sealed and protected; a protection target to be protected from inflow of the underfill, the protection target being formed on the substrate; and an underfill inflow prevention unit that is formed in the substrate so as to surround an entirety or a portion of the protection target.

In the first and second aspects of the present technology, the underfill is suppressed from flowing in the protection target by the underfill inflow prevention unit.

Effects of the Invention

In the first and second aspects of the present technology, a reduction in the size of a substrate can be realized, and a void risk in an underfill can be reduced.

BRIEF DESCRIPTION OF DRAWINGS

FIG. 9 is a sectional view illustrating a third variation.

MODE FOR CARRYING OUT THE INVENTION

A best mode for carrying out the present technology (hereinafter referred to as an embodiment) will be described below in detail with reference to the drawings.

Configuration Example of Solid-State Image Sensor

First, the configuration of a solid-state image sensor that causes the necessity of the present technology will be described with reference to FIGS. 1 to 3, before a solid-state image sensor according to the present embodiment is described.

Figure 1:
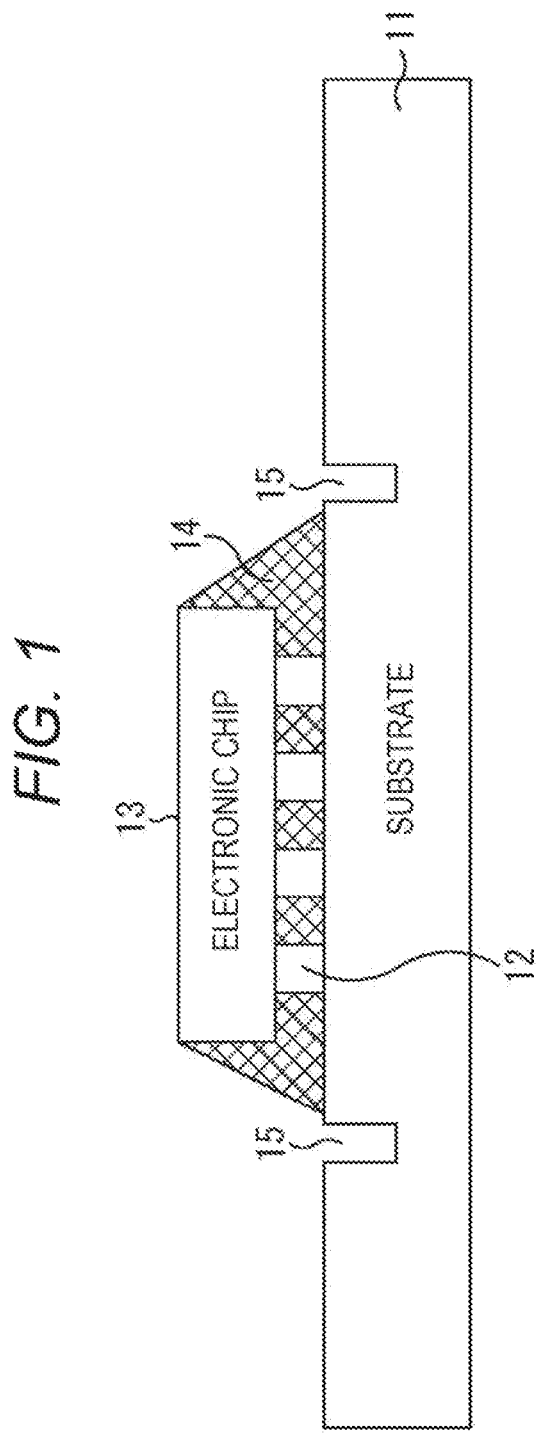
FIG. 1 is a sectional view illustrating an example of a configuration in which a groove is formed above a substrate.

FIG. 1 is a sectional view illustrating an example of the configuration of a solid-state image sensor in which a groove is formed above a substrate. FIG. 2 is a top view that corresponds to FIG. 1.

As illustrated in FIG. 1, an electronic chip 13 is placed above a substrate 11, and a space between the substrate 11 and the electronic chip 13 is filled with an underfill 14 that seals electrodes 12 that electrically connect the substrate 11 and the electronic chip 13. Furthermore, in the substrate 11, a groove 15 is formed in the shape of a frame that surrounds a position where the electronic chip 13 is placed, as illustrated in FIG. 2, and the groove 15 suppresses the underfill 14 from spreading.

Figure 2:
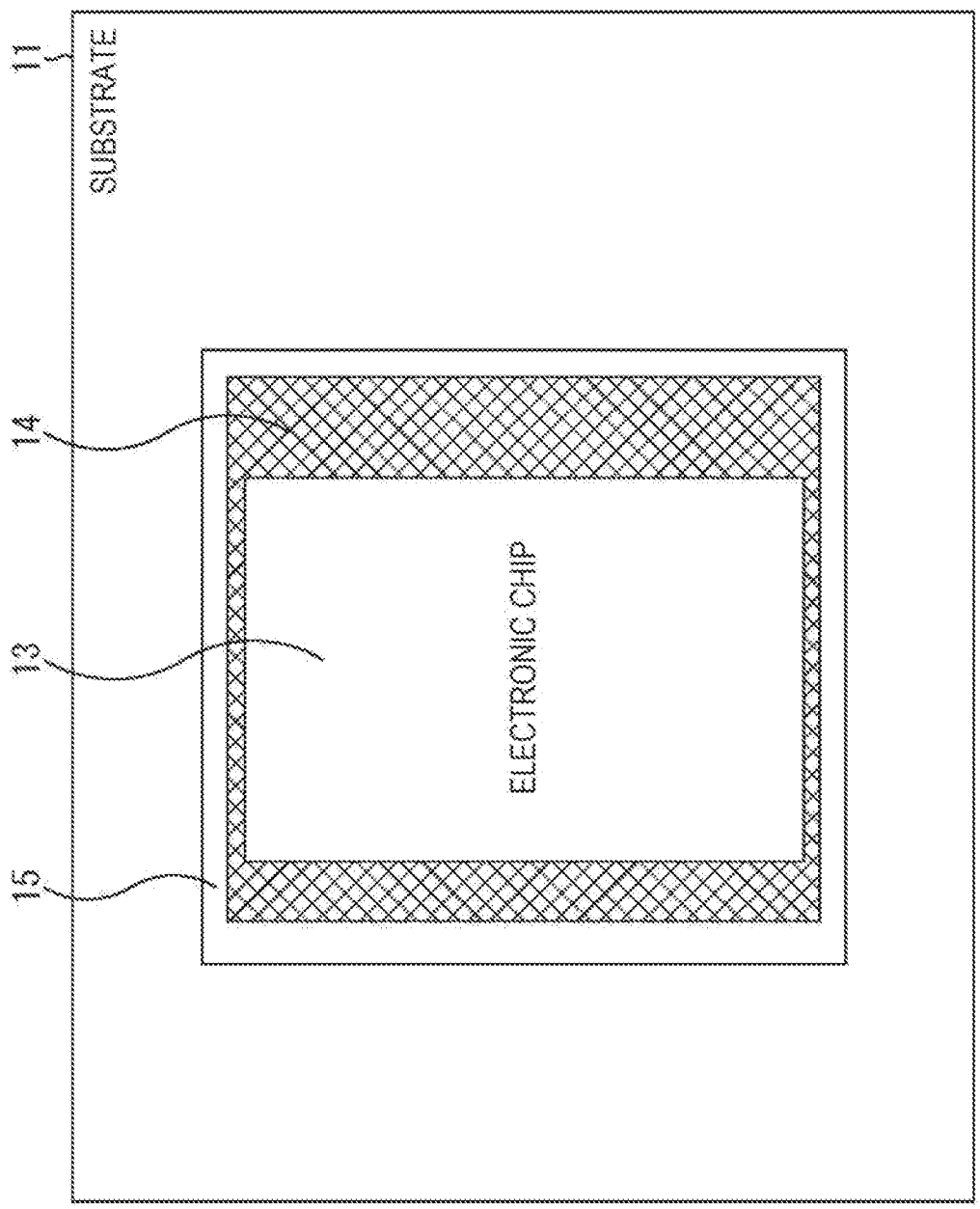
FIG. 2 is a top view illustrating the example of a configuration in which a groove is formed above a substrate.
Figure 3:
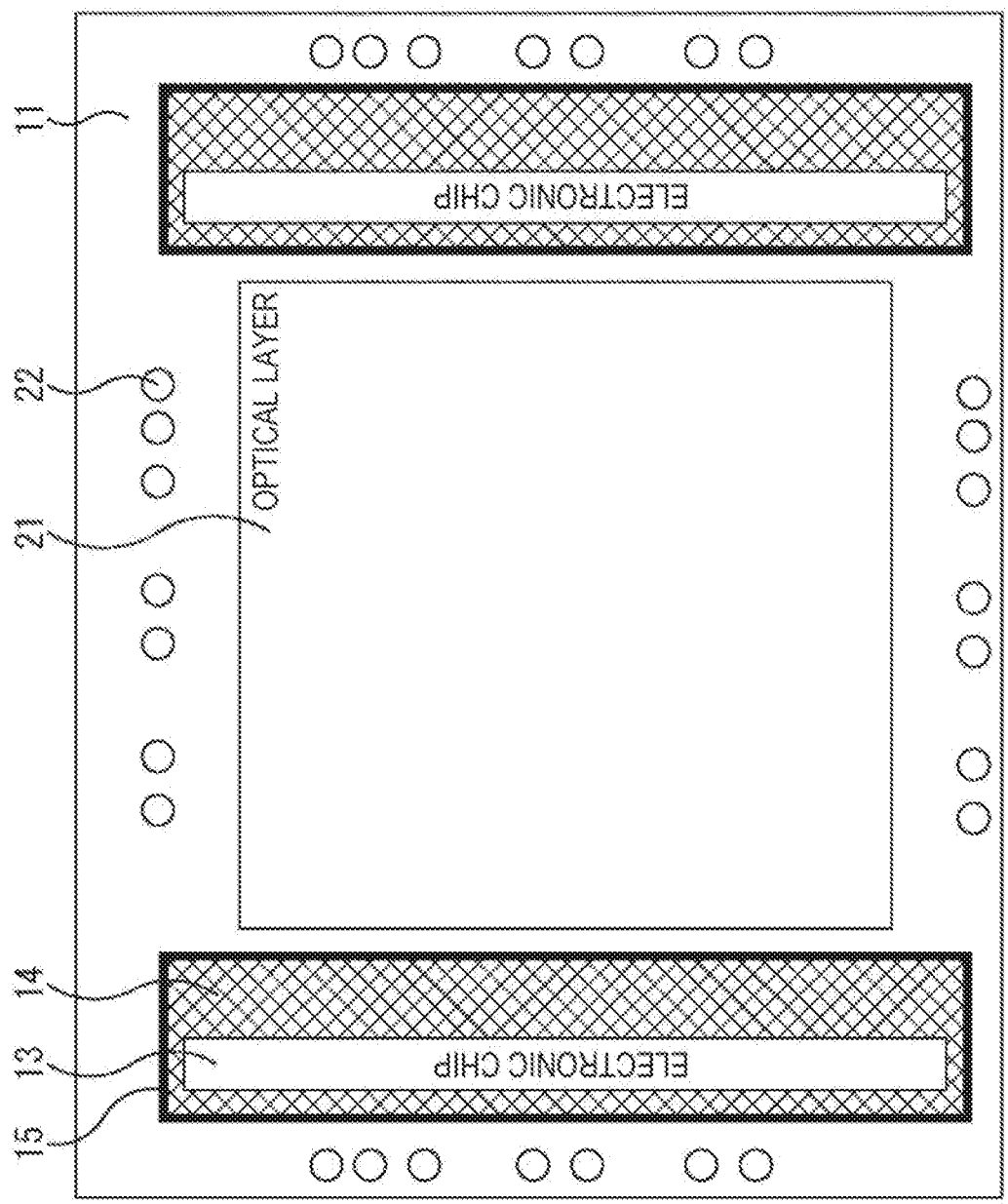
FIG. 3 is a top view illustrating an example of a configuration in a case where the technology described with reference to FIGS. 1 and 2 has been applied to a substrate that configures a solid-state image sensor.

FIG. 3 is a top view illustrating an example of a configuration in a case where the technology described with reference to FIGS. 1 and 2 has been applied to a substrate that configures a solid-state image sensor.

In FIG. 3, an optical layer 21 that includes a photodetector such as a photodiode (PD) is formed on a surface of a substrate 11 that includes Si or the like. Furthermore, connection pads 22 that are connected to a wire or the like that transmits various signals to external equipment are formed on the substrate 11. Moreover, an electronic chip 13 that includes a logic circuit or the like is placed above the substrate 11.

A space between the substrate 11 and the electronic chip 13 is filled with an underfill 14 that seals electrodes 12 that electrically connect the substrate 11 and the electronic chip 13. Furthermore, a groove 15 is formed in a frame shape around a position where the electronic chip 13 is placed of the substrate 11. By forming the groove 15, the underfill 14 is suppressed from spreading to the optical layer 21 or the connection pads 22.

In the case of the configuration described above, it is requested that the underfill 14 be reliably kept within a range surrounded by the groove 15 and that a position where filling with the underfill 14 is started be provided, and therefore it is requested that the size of a frame configured by the groove 15 be formed so as to be greater than the size of the electronic chip 13. Therefore, in a method for forming the groove 15 so as to surround the electronic chip 13, it is difficult to increase the area efficiency of the substrate 11, and the substrate 11 is prevented from being reduced in size.

Furthermore, an amount of filling with the underfill 14 is limited depending on the size of the frame configured by the groove 15, and therefore there is a possibility that filling with the underfill 14 will fail to be sufficiently performed depending on the size of the frame. In a case where the underfill does not have a sufficient volume, a flow characteristic is degraded due to capillary action. In this case, a void is generated in the underfill 14, and there is a possibility that the electrodes 12 between the substrate 11 and the electronic chip 13 will not be reliably sealed or protected.

Figure 4:
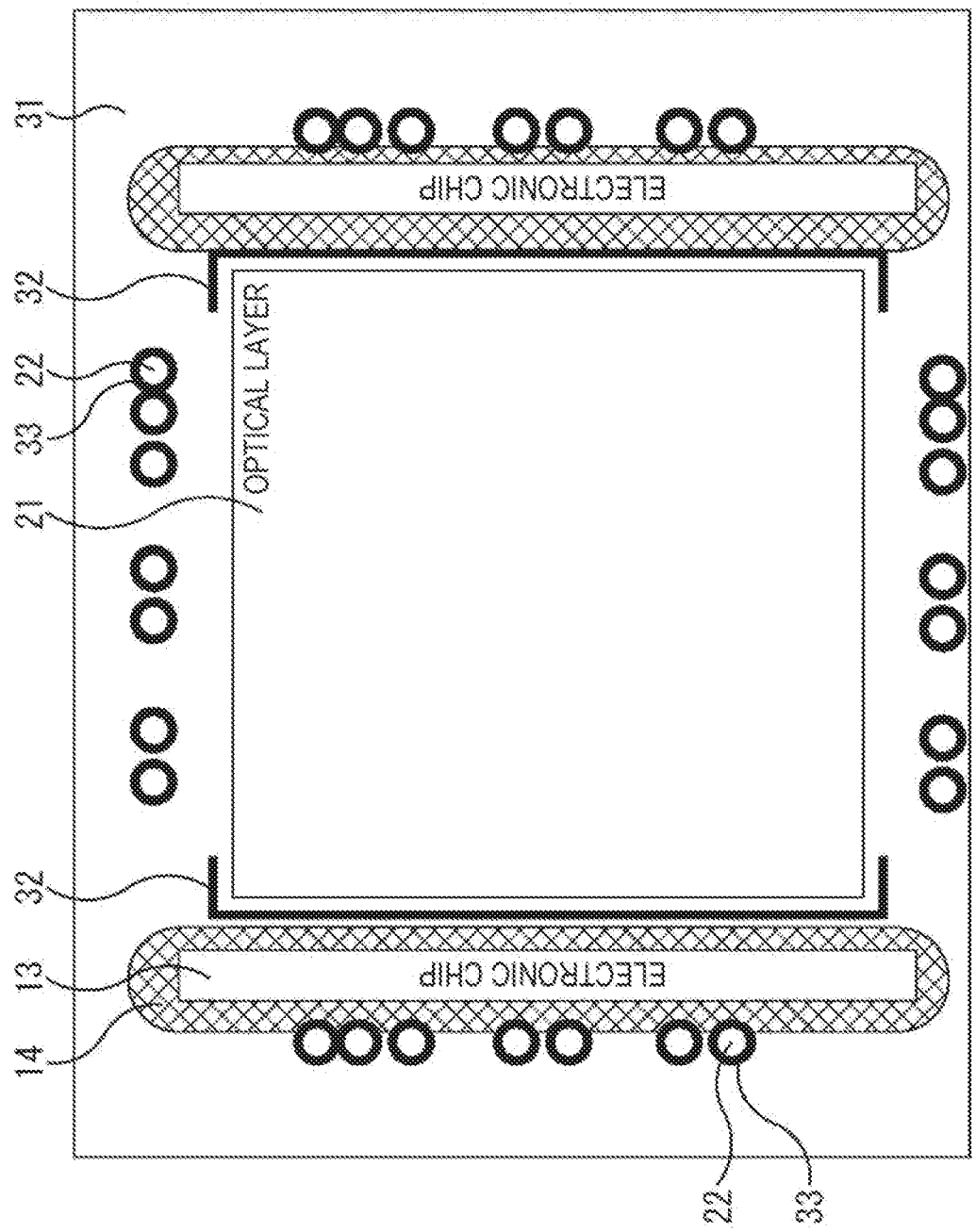
FIG. 4 is a top view illustrating a configuration example of a substrate of a solid-state image sensor to which the present technology has been applied.

Configuration Example of Solid-State Image Sensor According to the Present Embodiment FIG. 4 is a top view illustrating a configuration example of a substrate of a solid-state image sensor according to the present embodiment. However, in FIG. 4, components that are common to components in the example illustrated in FIG. 3 of the configuration of the solid-state image sensor are denoted by identical reference signs.

In FIG. 4, electronic chips 13 such as logic circuits are placed above a substrate 31 that includes Si or the like. Furthermore, an optical layer 21 that includes a photodetector such as a photodiode (PD) is formed on a surface of the substrate 31.

A space between the electronic chip 13 and the substrate 31 is filled with an underfill 14 that seals and protects electrodes 41 (FIG. 5) that electrically connect the electronic chip 13 and the substrate 31. Furthermore, an inflow prevention unit 32 that prevents the underfill 14 from flowing into the optical layer 21 is formed between a position where the electronic chip 13 is placed of the substrate 31 and the optical layer 21. Note that, as the inflow prevention unit 32, a recessed groove or a protruding wall may be formed in the substrate 31.

Moreover, connection pads 22 that are connected to a wire or the like that transmits various signals are formed in the substrate 31. Furthermore, an inflow prevention unit 33 that prevents the underfill 14 from flowing into the connection pad 22 is formed around the connection pad 22 of the substrate 31.

Note that, as the inflow prevention unit 33, a recessed groove or a protruding wall may be formed in the substrate 31.

Furthermore, the inflow prevention unit 33 may have a multiple structure such as a double or more structure rather than a single structure.

Figure 5:
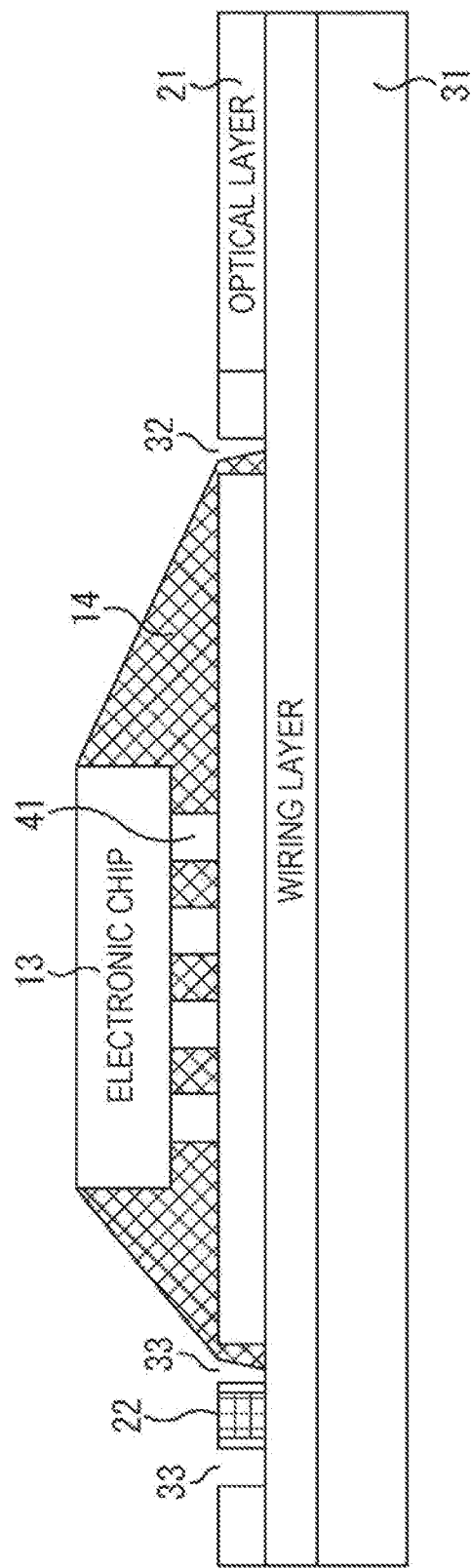
FIG. 5 is a sectional view in a case where an inflow prevention unit is a recessed groove.

FIG. 5 is a sectional view in a case where the inflow prevention units 32 and 33 are recessed grooves. An inclination angle θ of the recessed groove with respect to a surface of the substrate 31 is assumed to range from 60° to 90°. By setting the inclination angle θ to a steep angle of 60° to 90°, the inflow of the underfill 14 can be stopped on an upper surface of the groove due to the balance of a friction force between the substrate 31 and the underfill 14 and the surface tension of the underfill 14. The depth and width of the groove are formed in such a way that a ratio of the depth to the width (depth/width) falls in a range of 0.5 to 16000.

Figure 6:
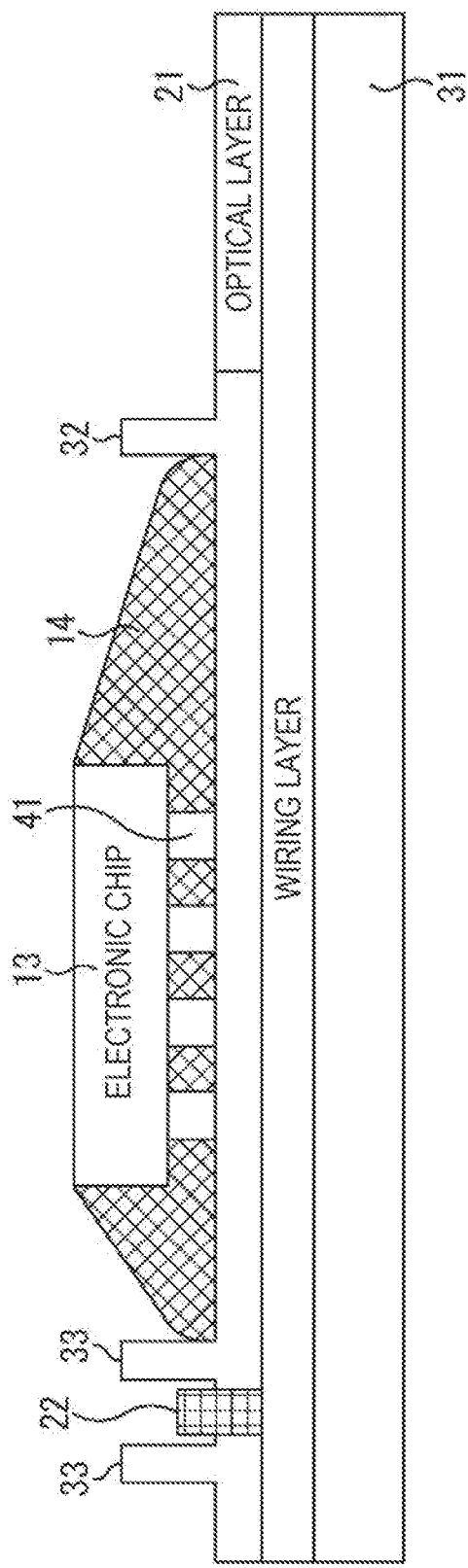
FIG. 6 is a sectional view in a case where the inflow prevention unit is a protruding wall.

FIG. 6 is a sectional view in a case where the inflow prevention units 32 and 33 are protruding walls.

Note that one of the inflow prevention units 32 and 33 may be formed to be a recessed groove and the other may be formed to be a protruding wall.

Comparison of Configuration

In the configurations illustrated in FIGS. 1 to 3 of the solid-state image sensor, outflow is prevented by surrounding the underfill 14 by using the groove 15 having a frame shape. In contrast, in the substrate 31 of the solid-state image sensor according to the present embodiment, the inflow prevention units 32 and 33 are provided between a region to be filled with the underfill 14 (in the case of FIG. 4, a portion below the electronic chip 13) and a section that the underfill 14 is not desired to flow into (in the case of FIG. 4, the optical layer 21 and the connection pads 22). With this arrangement, the underfill 14 is prevented from flowing into the section that the underfill 14 is not desired to flow into.

By employing the configuration described above, the groove 15 having a frame shape for which a size is larger than the size of the electronic chip 13, as in the configurations illustrated in FIGS. 1 to 3 of the solid-state image sensor, does not need to be formed. Therefore, for example, the optical layer 21 in the substrate 31 and the electronic chip 13 can be arranged in such a way that a distance between the optical layer 21 and the electronic chip 13 is shorter than distances in the configurations illustrated in FIGS. 1 to 3 of the solid-state image sensor. Thus, the area efficiency of the substrate 31 can be increased, and the size of the substrate 31 can be reduced.

Furthermore, the groove 15 having a frame shape is not formed. Therefore, the underfill 14 does not need to be kept inside a frame, filling with the underfill 14 having a sufficient amount can be performed, and a void is suppressed from being generated in the underfill 14. Thus, the electrodes 41 between the substrate 31 and the electronic chip 13 can be reliably sealed and protected.

Note that the present technology is not only applicable to a substrate that configures a solid-state image sensor, but is also applicable to a substrate that configures a general electronic apparatus.

However, only in an optical device such as a solid-state image sensor, the underfill 14 flows to the vicinity of pixels of the optical layer 21, and image deterioration such as a flare or a ghost may occur depending on a material that forms the optical layer 21. As a countermeasure against this, a method for reducing such a risk by selecting a material, making a coating material multilayered, or the like may be applied. For example, an underfill may be used in a first layer, and a light shielding material or the like may only be used in a portion near the pixels of a second layer.

First Variation

In the configuration example illustrated in FIG. 4, the inflow prevention unit 33 is formed so as to surround each of the connection pads 22.

Figure 7:
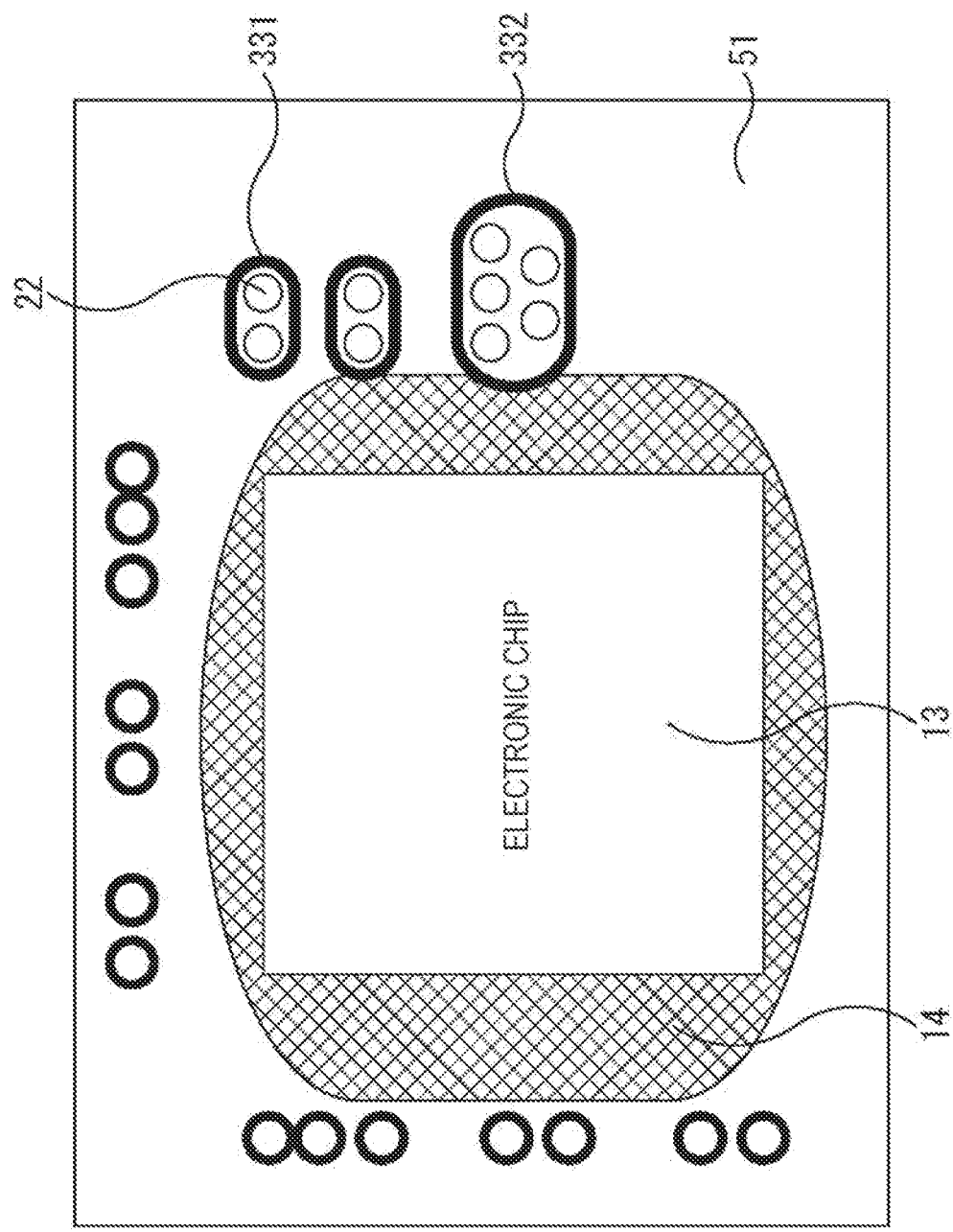
FIG. 7 is a top view illustrating a first variation.

FIG. 7 is a top view illustrating a configuration example (a first variation) in which the inflow prevention unit 33 is formed so as to surround a plurality of connection pads 22. In other words, in FIG. 7, an inflow prevention unit 331 that surrounds two connection pads 22 and an inflow prevention unit 332 that surrounds five connection pads 22 are formed.

In the case of this drawing, the groove 15 having a frame shape does not need to be formed. Therefore, the area efficiency of a substrate 51 can be increased, and the size of the substrate 51 can be reduced. Furthermore, the electrodes 41 between the substrate 51 and the electronic chip 13 can be reliably sealed and protected.

Moreover, the underfill 14 can be suppressed from flowing into each of the connection pads 22.

Second Variation

Figure 8:
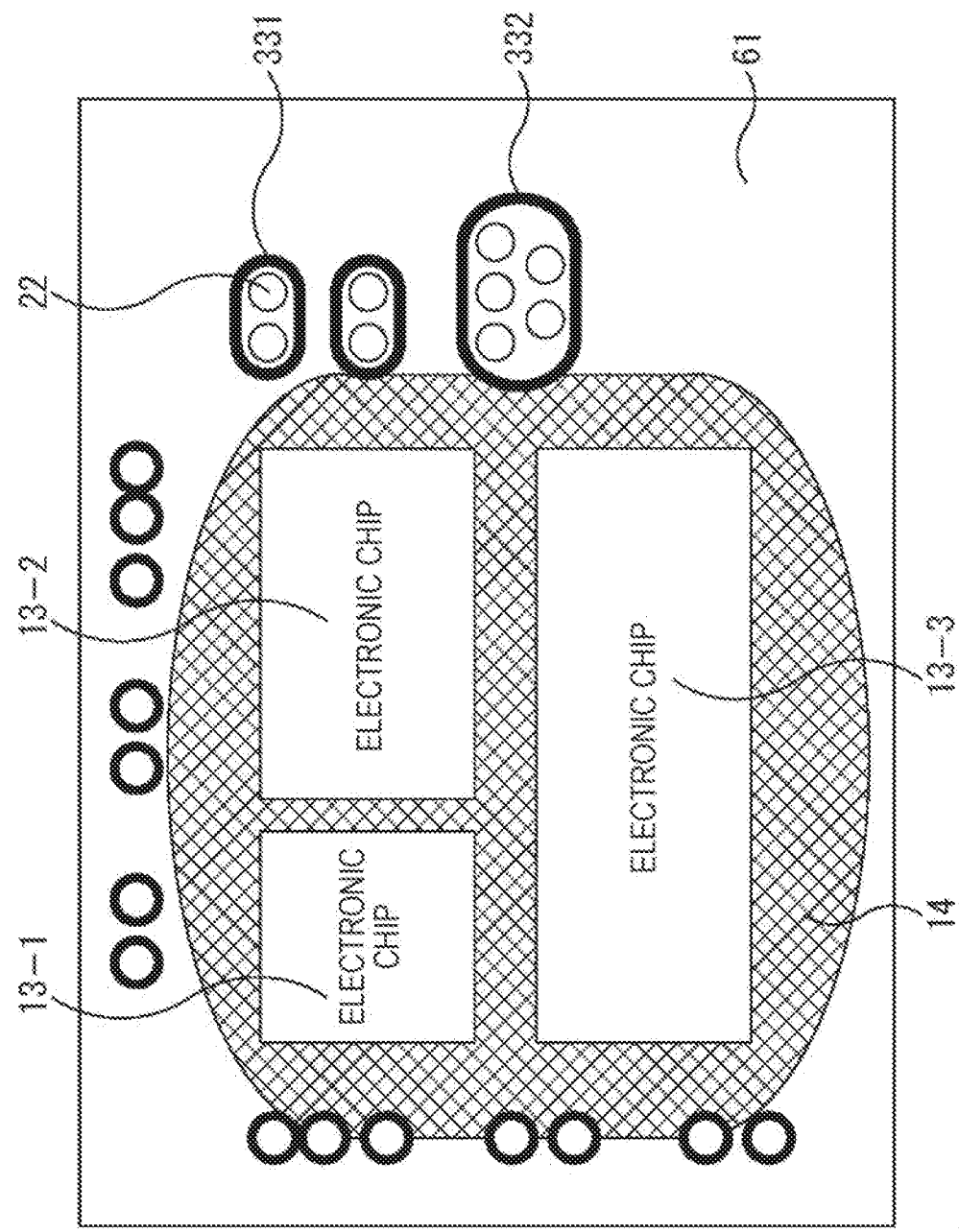
FIG. 8 is a top view illustrating a second variation.

FIG. 8 is a top view illustrating a configuration example (a second variation) in which a plurality of electronic chips 13 is placed above a substrate 61 and a space between the plurality of electronic chips 13 and the substrate 61 is integrally filled with the underfill 14. In other words, in FIG. 8, a space between three electronic chips 13-1 to 13-3 and the substrate 61 is integrally filled with the underfill 14.

In the case of this drawing, each of the electronic chips 13 does not need to be surrounded by the groove 15 having a frame shape. Therefore, the area efficiency of the substrate 61 can be increased, and the size of the substrate 61 can be reduced. Furthermore, the electrodes 41 between the substrate 61 and each of the electronic chips 13 can be reliably sealed and protected.

Third Variation

FIG. 9 is a sectional view illustrating the case a configuration example (a third configuration example) in which a plurality of substrates 71 is stacked.

In other words, in FIG. 9, substrates 71-1 and 71-2 are stacked via relay solder balls 72, substrates 71-2 and 71-3 are stacked via the relay solder balls 72, the electronic chip 13 is placed above each of the substrates 71, and a space between the electronic chip 13 and the substrate 71 is filled with the underfill 14. Furthermore, the inflow prevention unit 32 is formed between a region to be filled with the underfill 14 of each of the substrates 71 (a portion below the electronic chip 13) and a section that the underfill 14 is not desired to flow into (in the case of FIG. 9, a surface component 73 and the relay solder balls 72).

In the case of this drawing, effects that are similar to effects in the configuration examples or variations described above can be achieved.

First Configuration Example of Structure Between Underfill and Optical Layer

A first configuration example of a structure between the underfill 14 and the optical layer 21 is described with reference to FIGS. 10A and 10B.

Figure 10A:
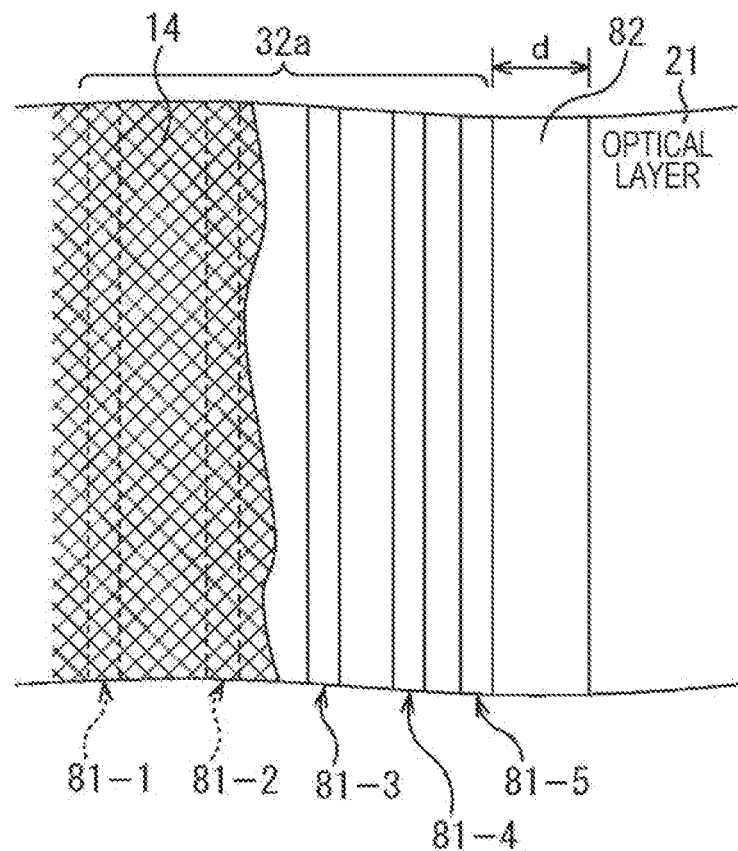
FIGS. 10A and 10B are diagrams explaining a first configuration example of a structure between an underfill and an optical layer.
Figure 10B:
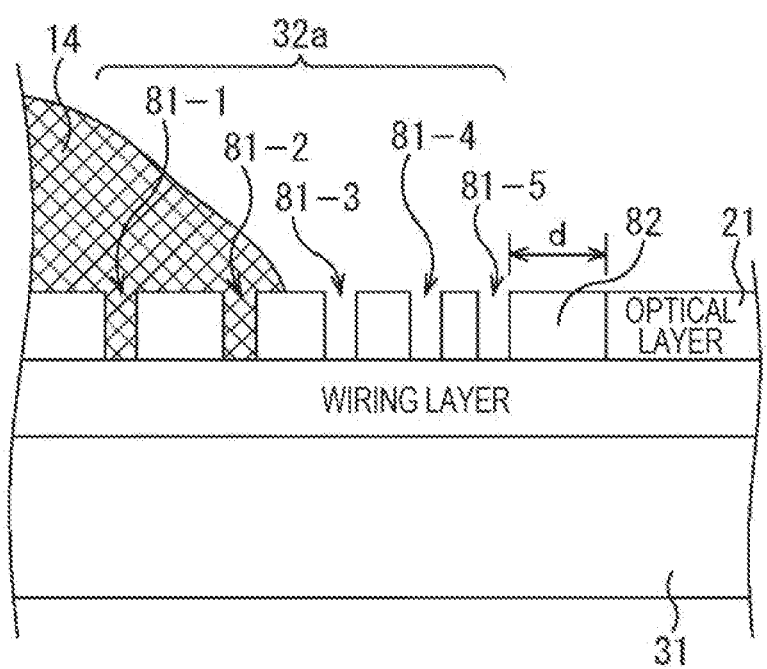

FIG. 10A illustrates a top view in which a portion between the underfill 14 and the optical layer 21 has been enlarged, and FIG. 10B illustrates a sectional view that corresponds to FIG. 10A.

For example, as described with reference to FIG. 4, the inflow prevention unit 32 that prevents the underfill 14 from flowing into the optical layer 21 is formed between the underfill 14 and the optical layer 21. Note that a not-illustrated black-color filter may be stacked on a surface of the underfill 14 in order to suppress the surface reflection of the underfill 14, and the black-color filter may be stacked in all of the configuration examples described below.

As described above, the inflow prevention unit 32 can have a configuration formed by a recessed groove (FIG. 5) or a protruding wall (FIG. 6), or a multiple structure including two or more recessed grooves or protruding walls can be employed.

The inflow prevention unit 32a illustrated in FIGS. 10A and 10B has a configuration in which five recessed groove portions 81-1 to 81-5 are formed. Furthermore, in the example illustrated in FIGS. 10A and 10B, the recessed groove portions 81-1 and 81-2 are covered with the underfill 14. In other words, the underfill 14 enters the recessed groove portions 81-1 and 81-2, and this prevents the underfill 14 from flowing into the optical layer 21.

Then, it is desirable that the inflow prevention unit 32a be formed in such a way that an interval at which each of a plurality of recessed groove portions 81 is arranged is a non-identical pitch, in order to suppress an influence of reflected light and interference light on a portion that is not covered with the underfill 14.

For example, as illustrated, the plurality of recessed groove portions 81 is arranged at a non-identical pitch in such a way that an interval between the recessed groove portions 81 is reduced in a direction from the underfill 14 to the optical layer 21. Note that the plurality of recessed groove portions 81 may be arranged at a non-identical pitch at which the interval between the plurality of recessed groove portions 81 increases in a direction from the underfill 14 to the optical layer 21 or at a non-identical pitch at which the interval between the plurality of recessed groove portions 81 is set at random.

Moreover, regarding the size of the inflow prevention unit 32a, it is preferable that processing be performed in such a way that the width of the recessed groove portion 81 and the interval (the pitch) between the recessed groove portions 81 range from $\lambda/8$ to $30\lambda$ with respect to a center wavelength $\lambda$ of incident light that enters the optical layer 21. For example, processing is performed in such a way that the width of the recessed groove portion 81 and the interval between the recessed groove portions 81 range from 70 nm to 16,500 nm with respect to a center wavelength of 550 nm. Specifically, each of the widths of the recessed groove portions 81-1 to 81-5 is processed to be 3,000 nm, an interval between the recessed groove portions 81-1 and 81-2 is processed to be 10,000 nm, an interval between the recessed groove portions 81-2 and 81-3 is processed to be 7,000 nm, an interval between the recessed groove portions 81-3 and 81-4 is processed to be 5,000 nm, and an interval between the recessed groove portions 81-4 and 81-5 is processed to be 3,000 nm.

Furthermore, a flat region 82 on which processing such as a groove is not performed is provided between the inflow prevention unit 32a and the optical layer 21. Then, it is preferable that a width d of the flat region 82 and in other words, a distance from the inflow prevention unit 32a to the optical layer 21 be formed to range from $\lambda/8$ to $30\lambda$ with respect to a center wavelength $\lambda$ of incident light that enters the optical layer 21, in order to suppress an influence of reflected light or interference light. For example, it is preferable that the width d of the flat region 82 range from 70 nm to 16,500 nm with respect to a center wavelength of 550 nm.

As described above, a structure, in which the inflow prevention unit 32a includes the plurality of recessed groove portions 81 arranged at a non-identical pitch as well as the width d of the flat region 82 falls in a prescribed range, is employed between the underfill 14 and the optical layer 21. By doing this, the underfill 14 can be prevented from flowing into the optical layer 21, an influence of reflected light and interference light can be suppressed between the underfill 14 and the optical layer 21, and the deterioration of image quality due to, for example, a flare, a ghost, or the like can be avoided.

Second Configuration Example of Structure Between Underfill and Optical Layer

A second configuration example of the structure between the underfill 14 and the optical layer 21 is described with reference to FIGS. 11A and 11B. Note that, in the structure illustrated in FIGS. 11A and 11B, portions that are common to portions in the structure illustrated in FIGS. 10A and 10B are denoted by identical reference signs, and the detailed description thereof is omitted.

Figure 11A:
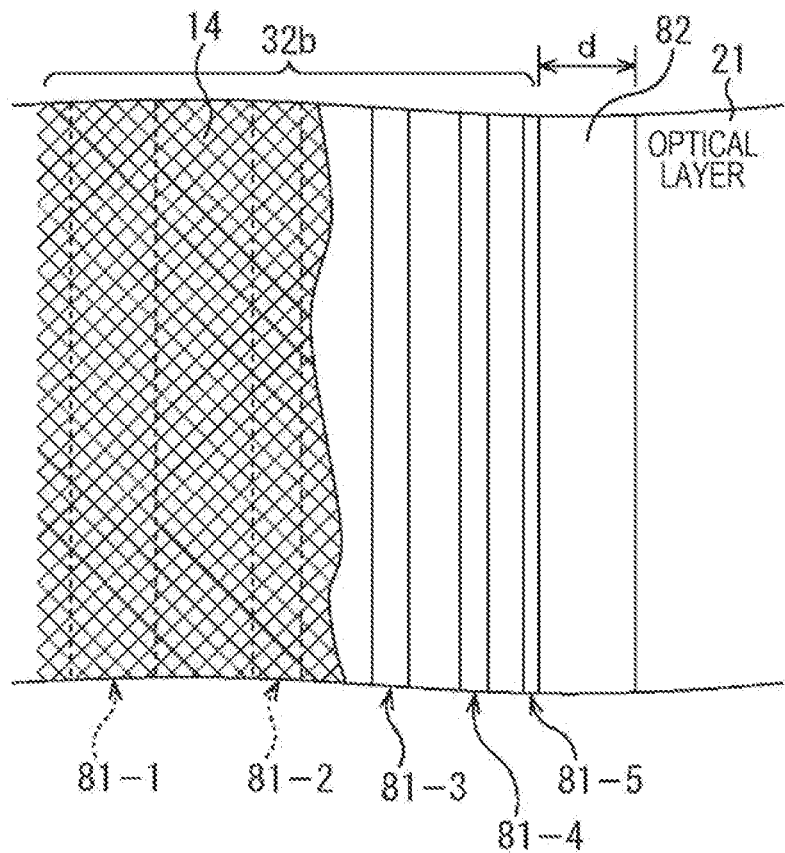
FIGS. 11A and 11B are diagrams explaining a second configuration example of the structure between the underfill and the optical layer.
Figure 11B:
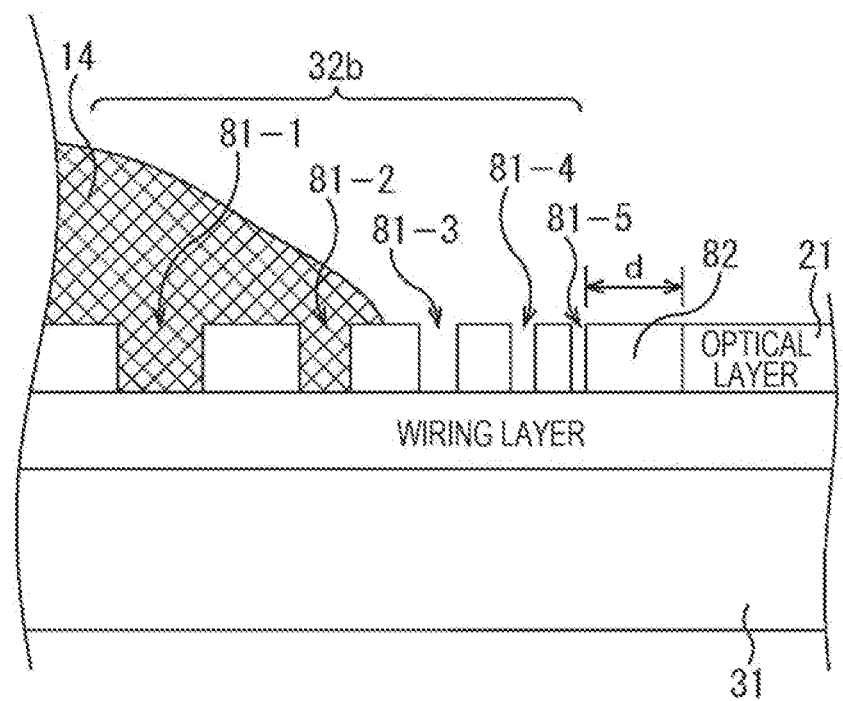

FIG. 11A illustrates a top view in which a portion between the underfill 14 and the optical layer 21 has been enlarged, and FIG. 11B illustrates a sectional view that corresponds to FIG. 11A.

The inflow prevention unit 32b illustrated in FIGS. 11A and 11B has a configuration in which five recessed groove portions 81-1 to 81-5 are formed. Furthermore, in the example illustrated in FIGS. 11A and 11B, the recessed groove portions 81-1 and 81-2 are covered with the underfill 14. In other words, the underfill 14 enters the recessed groove portions 81-1 and 81-2, and this prevents the underfill 14 from flowing into the optical layer 21.

Then, it is desirable that the inflow prevention unit 32b be formed in such a way that a plurality of recessed groove portions 81 has widths that are not identical to each other and an interval at which each of the plurality of recessed groove portions 81 is arranged is a non-identical pitch, in order to suppress an influence of reflected light and interference light on a portion that is not covered with the underfill 14. In other words, the inflow prevention unit 32b is configured in such a way that the widths of the plurality of recessed groove portions 81 are different from each other and intervals between the plurality of recessed groove portions 81 are different from each other.

For example, as illustrated, the plurality of recessed groove portions 81 having non-identical widths is arranged at a non-identical pitch, in such a way that the width of the recessed groove portion 81 is reduced and an interval between the recessed groove portions 81 is reduced in a direction from the underfill 14 to the optical layer 21. Note that the plurality of recessed groove portions 81 may be arranged at a non-identical pitch at which the width of the recessed groove portion 81 increases and the interval between the recessed groove portions 81 increases in a direction from the underfill 14 to the optical layer 21 or at a non-identical pitch at which the widths of the recessed groove portions 81 and the intervals between the recessed groove portions 81 are set at random.

Moreover, regarding the size of the inflow prevention unit 32b, it is preferable that processing be performed in such a way that the width of the recessed groove portion 81 and the interval (the pitch) between the recessed groove portions 81 range from $\lambda/8$ to $30\lambda$ with respect to a center wavelength $\lambda$ of incident light that enters the optical layer 21. For example, processing is performed in such a way that the width of the recessed groove portion 81 and the interval between the recessed groove portions 81 range from 70 nm to 16,500 nm with respect to a center wavelength of 550 nm. Specifically, the width of the recessed groove portion 81-1 is processed to be 10,000 nm, the width of the recessed groove portion 81-2 is processed to be 7,000 nm, the width of the recessed groove portion 81-3 is processed to be 5,000 nm, the width of the recessed groove portion 81-4 is processed to be 3,000 nm, and the width of the recessed groove portion 81-5 is processed to be 1,000 nm. Furthermore, an interval between the recessed groove portions 81-1 and 81-2 is processed to be 10,000 nm, an interval between the recessed groove portions 81-2 and 81-3 is processed to be 7,000 nm, an interval between the recessed groove portions 81-3 and 81-4 is processed to be 5,000 nm, and an interval between the recessed groove portions 81-4 and 81-5 is processed to be 3,000 nm.

Furthermore, it is preferable that a width d of a flat region 82 that is provided between the inflow prevention unit 32*b* and the optical layer 21 be formed to range from λ/8 to 30λ with respect to a center wavelength A of incident light that enters the optical layer 21, similarly to the description given above with reference to FIGS. 10A and 10B.

As described above, a structure, in which the inflow prevention unit 32*b* includes the plurality of recessed groove portions 81 having non-identical widths and arranged at a non-identical pitch and the width d of the flat region 82 falls in a prescribed range, is employed between the underfill 14 and the optical layer 21. By doing this, the underfill 14 can be prevented from flowing into the optical layer 21, an influence of reflected light and interference light can be suppressed between the underfill 14 and the optical layer 21, and the deterioration of image quality due to, for example, a flare, a ghost, or the like can be avoided.

Third and Fourth Configuration Examples of Structure Between Underfill and Optical Layer Third and fourth configuration examples of the structure between the underfill 14 and the optical layer 21 are described with reference to FIGS. 12 and 13. Note that, in the structures illustrated in FIGS. 12 and 13, portions that are common to portions in the structure illustrated in FIGS. 10A and 10B are denoted by identical reference signs, and the detailed description thereof is omitted.

Figure 12:
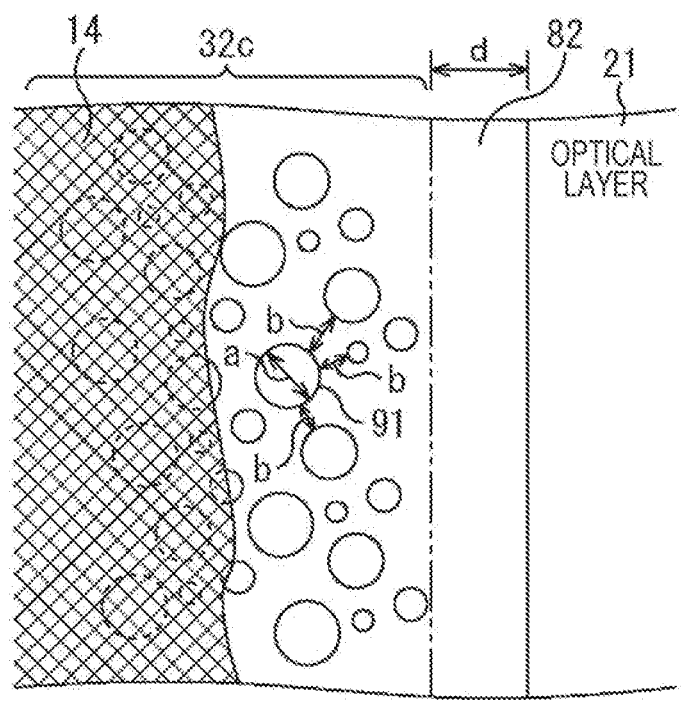
FIG. 12 is a diagram explaining a third configuration example of the structure between the underfill and the optical layer.
Figure 13:
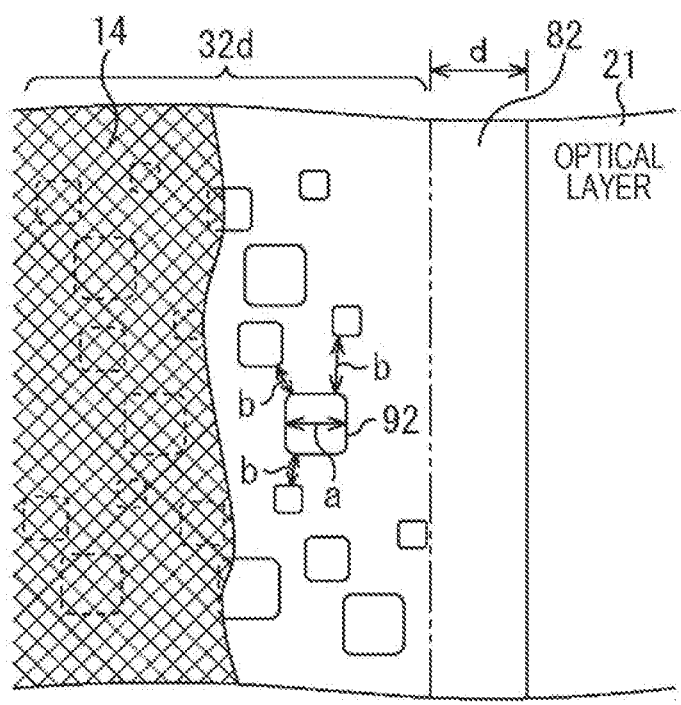
FIG. 13 is a diagram explaining a fourth configuration example of the structure between the underfill and the optical layer.

FIG. 12 illustrates a top view in the third configuration example of the structure between the underfill 14 and the optical layer 21, and FIG. 13 illustrates a top view in the fourth configuration example of the structure between the underfill 14 and the optical layer 21.

The inflow prevention unit 32*c* illustrated in FIG. 12 has a configuration in which a plurality of circular recesses 91 is formed in a discontinuous arrangement. Furthermore, in the example illustrated in FIG. 12, some of the plurality of circular recesses 91 are covered with the underfill 14. In other words, the underfill 14 enters the some of the plurality of circular recesses 91, and this prevents the underfill 14 from flowing into the optical layer 21.

Then, it is desirable that the inflow prevention unit 32*c* be processed in such a way that the plurality of circular recesses 91 has sizes that are not identical to each other and are arranged at a non-identical pitch, in order to suppress an influence of reflected light and interference light on a portion that is not covered with the underfill 14. In other words, the inflow prevention unit 32*c* is processed in such a way that the diameters a of the plurality of circular recesses 91 are different from each other and intervals b between the plurality of circular recesses 91 are different from each other, and is processed in such a way that the respective diameters a and the respective intervals b are set at random.

Moreover, regarding the size of the inflow prevention unit 32*c*, it is preferable that processing be performed in such a way that the diameter a of the circular recess 91 and the interval b between the circular recesses 91 range from λ/8 to 30λ with respect to a center wavelength λ of incident light that enters the optical layer 21. For example, processing is performed in such a way that the diameter a of the circular recess 91 and the interval b between the circular recesses 91 range from 70 nm to 16,500 nm with respect to a center wavelength of 550 nm. Specifically, the diameters a of the plurality of circular recesses 91 are processed at random to be 10,000 nm, 7,000 nm, 5,000 nm, 3,000 nm, and 1,000 nm, respectively, and the intervals b between the circular recesses 91 are processed at random to be 5,000 nm, 3,000 nm, and 1,000 nm, respectively.

Furthermore, it is preferable that a width d of a flat region 82 that is provided between the inflow prevention unit 32*c* and the optical layer 21 be formed to range from λ/8 to 30λ with respect to a center wavelength A of incident light that enters the optical layer 21, similarly to the description given above with reference to FIGS. 10A and 10B.

Note that the inflow prevention unit 32*d* illustrated in FIG. 13 has a configuration in which a plurality of rectangular recesses 92 are formed at random similarly to the circular recesses 91 of the inflow prevention unit 32*c* illustrated in FIG. 12, and has a similar configuration in the other respects. Note that the inflow prevention unit 32 may have a configuration in which recesses having a shape that is not circular or rectangular are arranged at random.

Furthermore, it is desirable that a configuration be always employed in which some of the circular recesses 91 that are formed in the inflow prevention unit 32*c* or some of the rectangular recesses 92 that are formed in the inflow prevention unit 32*d* appear between the underfill 14 and the optical layer 21, rather than a configuration in which the entire portion between the underfill 14 and the optical layer 21 is flat.

As described above, between the underfill 14 and the optical layer 21, a structure is employed in which the inflow prevention unit 32*c* includes the circular recesses 91 that are arranged at random, or the inflow prevention unit 32*d* includes the rectangular recesses 92, and the width d of the flat region 82 falls in a prescribed range. By doing this, the underfill 14 can be prevented from flowing into the optical layer 21, an influence of reflected light and interference light can be suppressed between the underfill 14 and the optical layer 21, and the deterioration of image quality due to, for example, a flare, a ghost, or the like can be avoided.

Application Example

The present technology may be implemented, for example, as an apparatus that is installed on any type of moving body such as a vehicle, an electric vehicle, a hybrid electric vehicle, a motorcycle, a bicycle, a personal mobility, an airplane, a drone, a ship, a robot, a construction machine, or an agricultural machine (a tractor).

Figure 14:
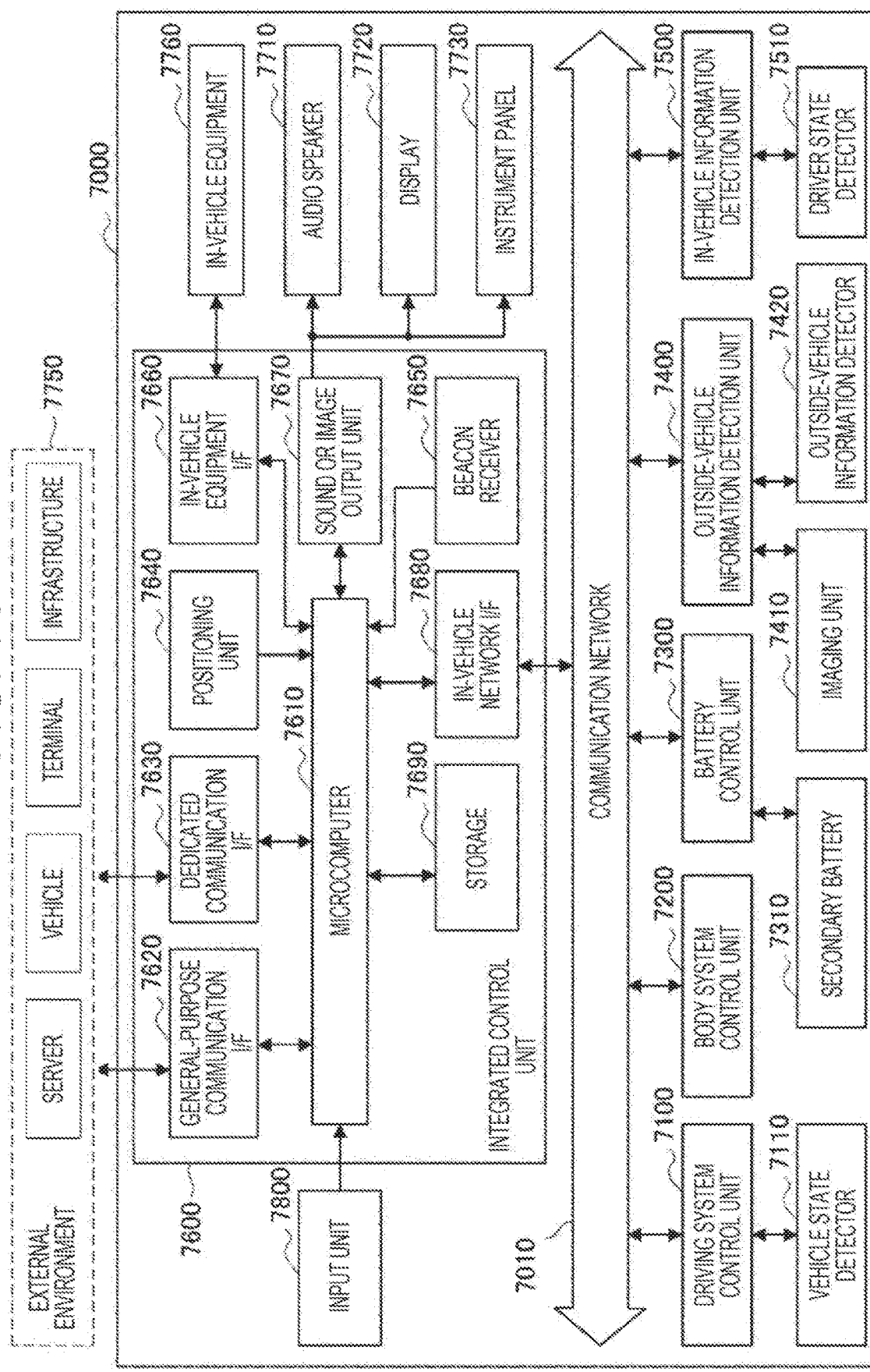
FIG. 14 is a block diagram illustrating an example of a rough configuration of a vehicle control system.

FIG. 14 is a block diagram illustrating a rough configuration example of a vehicle control system 7000 that is an example of a moving body control system to which a technology according to the present disclosure may be applied. The vehicle control system 7000 includes a plurality of electronic control units that are connected via a communication network 7010. In the example illustrated in FIG. 14, the vehicle control system 7000 includes a driving system control unit 7100, a body system control unit 7200, a battery control unit 7300, an outside-vehicle information detection unit 7400, an in-vehicle information detection unit 7500, and an integrated control unit 7600. The communication network 7010 that connect these plurality of control units may be an in-vehicle communication network in compliance with an arbitrary standard such as a controller area network (CAN), a local interconnect network (LIN), a local area network (LAN), or a FlexRay (registered trademark), for example.

Each of the control units includes a microcomputer that performs arithmetic processing in accordance with various programs, a storage that stores a program that is executed by the microcomputer, a parameter used in various arithmetic operations, or the like, and a driving circuit that drives various apparatuses to be controlled. Each of the control units includes a network I/F that performs communication with another control unit via the communication network 7010, and also includes a communication I/F that performs communication with an apparatus, a sensor, or the like inside or outside a vehicle through wired communication or wireless communication. In FIG. 14, a microcomputer 7610, a general-purpose communication I/F 7620, a dedicated communication I/F 7630, a positioning unit 7640, a beacon receiver 7650, an in-vehicle equipment I/F 7660, a sound or image output unit 7670, an in-vehicle network I/F 7680, and a storage 7690 are illustrated as a functional configuration of the integrated control unit 7600. The other control units similarly include the microcomputer, the communication I/F, the storage, and the like.

The driving system control unit 7100 controls an operation of an apparatus that relates to a driving system of a vehicle in accordance with various programs. For example, the driving system control unit 7100 functions as a control apparatus of a driving force generation apparatus that generates a driving force of a vehicle, such as an internal combustion engine or a driving motor, a driving force transmission mechanism that transmits the driving force to wheels, a steering mechanism that adjusts a steering angle of the vehicle, a braking apparatus that generates a braking force of the vehicle, and the like. The driving system control unit 7100 may have a function of a control apparatus of an antilock brake system (ABS), electronic stability control (ESC), or the like.

A vehicle state detector 7110 is connected to the driving system control unit 7100. The vehicle state detector 7110 includes, for example, at least one of a gyro sensor that detects the angular velocity of a shaft rotary motion of a vehicle body, an acceleration sensor that detects the acceleration of a vehicle, or a sensor that detects an amount of an operation performed on an accelerator pedal, an amount of an operation performed on a brake pedal, a steering angle of a steering wheel, engine speed, the rotational speed of a wheel, or the like. The driving system control unit 7100 performs arithmetic processing using a signal input from the vehicle state detector 7110, and controls the internal combustion engine, the driving motor, an electric power steering apparatus, a brake apparatus, or the like.

The body system control unit 7200 controls the operations of various apparatuses equipped in the vehicle body in accordance with various programs. For example, the body system control unit 7200 functions as a control apparatus of a keyless entry system, a smart key system, a power window apparatus, or various lamps such as a headlamp, a back lamp, a brake lamp, a turn signal, or a fog lamp. In this case, radio waves transmitted from a portable machine that is substituted for a key or signals of various switches may be input to the body system control unit 7200. The body system control unit 7200 receives an input of these radio waves or signals, and controls a door locking apparatus, the power window apparatus, a lamp, or the like of the vehicle.

The battery control unit 7300 controls a secondary battery 7310 serving as a power supply source of the driving motor in accordance with various programs. For example, information relating to battery temperature, a battery output voltage, the residual capacity of a battery, or the like is input to the battery control unit 7300 from a battery apparatus including the secondary battery 7310. The battery control unit 7300 performs arithmetic processing using these signals, and performs temperature regulating control on the secondary battery 7310 or performs control on a cooling apparatus or the like that is included in the battery apparatus.

The outside-vehicle information detection unit 7400 detects information relating to the outside of a vehicle in which the vehicle control system 7000 is installed. For example, at least one of an imaging unit 7410 or an outside-vehicle information detector 7420 is connected to the outside-vehicle information detection unit 7400. The imaging unit 7410 includes at least one of a time-of-flight (ToF) camera, a stereo camera, a monocular camera, an infrared camera, or another camera. The outside-vehicle information detector 7420 includes, for example, at least one of an environmental sensor that detects current weather or atmospheric phenomena or a surrounding information detection sensor that detects another vehicle, an obstacle, a pedestrian, or the like around the vehicle in which the vehicle control system 7000 is installed.

The environmental sensor may be, for example, at least one of a raindrop sensor that detects rainy weather, a fog sensor that detects fog, a sunshine sensor that detects a level of sunshine, or a snow sensor that detects snowfall. The surrounding information detection sensor may be at least one of an ultrasonic sensor, a radar apparatus, or a light detection and ranging or laser imaging detection and ranging (LIDAR) apparatus. The imaging unit 7410 and the outside-vehicle information detector 7420 described above may be included as independent sensors or apparatuses, or may be included as an apparatus in which a plurality of sensors or apparatuses is integrated.

Figure 15:
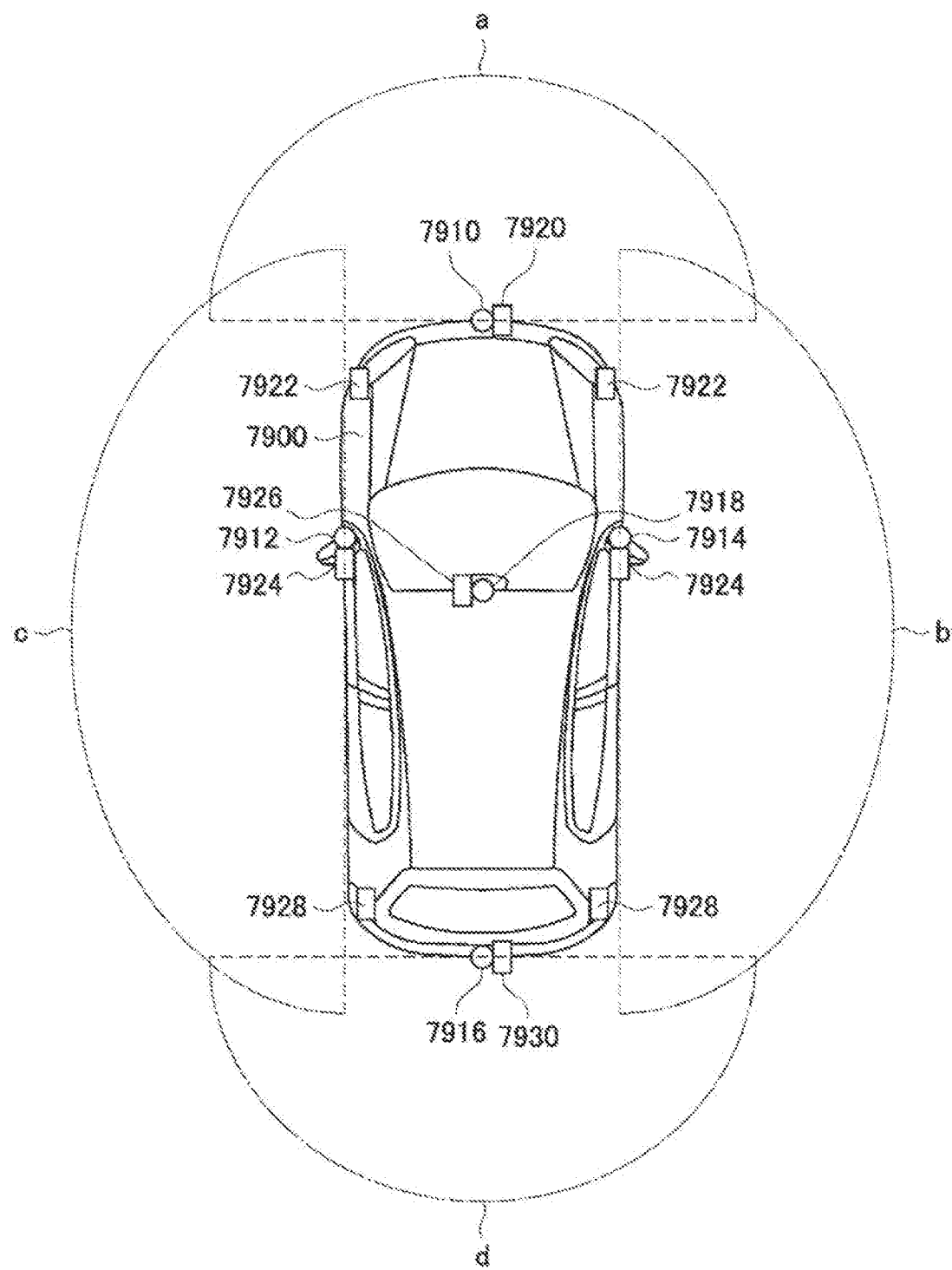
FIG. 15 is an explanatory drawing illustrating an example of the installation position of an outside-vehicle information detector and an imaging unit.

Here, FIG. 15 illustrates an example of the installation position of the imaging unit 7410 and the outside-vehicle information detector 7420. Imaging units 7910, 7912, 7914, 7916, and 7918 are provided, for example, in at least one position of a front nose, a side-view mirror, a rear bumper, a back door, or an upper portion of a windshield in a vehicle cabin of a vehicle 7900. The imaging unit 7910 included in the front nose and the imaging unit 7918 included in the upper portion of the windshield in the vehicle cabin principally obtain an image of a front side of the vehicle 7900. The imaging units 7912 and 7914 included in the side-view mirrors principally obtain an image of a side of the vehicle 7900. The imaging unit 7916 included in the rear bumper or the back door principally obtains an image of a rear side of the vehicle 7900. The imaging unit 7918 included in the upper portion of the windshield in the vehicle cabin is principally used to detect a preceding vehicle, or a pedestrian, an obstacle, a traffic light, a traffic sign, a traffic lane, or the like.

Note that FIG. 15 illustrates an example of a photographing range of each of the imaging units 7910, 7912, 7914, and 7916. An imaging range a indicates an imaging range of the imaging unit 7910 provided in the front nose, imaging ranges b and c respectively indicate imaging ranges of the imaging units 7912 and 7914 provided in the side-view mirrors, and an imaging range d indicates an imaging range of the imaging unit 7916 provided in the rear bumper or the back door. For example, an overhead image in which the vehicle 7900 is viewed from the above is obtained by superimposing pieces of image data that have been captured by the imaging units 7910, 7912, 7914, and 7916 onto each other.

Outside-vehicle information detectors 7920, 7922, 7924, 7926, 7928, and 7930 that are provided in a front portion, a rear portion, sides, corners, and the upper portion of the windshield in vehicle cabin of the vehicle 7900 may be, for example, ultrasonic sensors or radar apparatuses. The outside-vehicle information detectors 7920, 7926, and 7930 that are provided in the front nose, the rear bumper, the back door, and the upper portion of the windshield in the vehicle cabin of the vehicle 7900 may be, for example, LIDAR apparatuses. These outside-vehicle information detectors 7920 to 7930 are principally used to detect a preceding vehicle, a pedestrian, an obstacle, or the like.

Return to the description of FIG. 14. The outside-vehicle information detection unit 7400 causes the imaging unit 7410 to capture an image of the outside of the vehicle, and receives captured image data. Furthermore, the outside-vehicle information detection unit 7400 receives detection information from the connected outside-vehicle information detector 7420. In a case where the outside-vehicle information detector 7420 is an ultrasonic sensor, a radar apparatus, or a LIDAR apparatus, the outside-vehicle information detection unit 7400 causes ultrasonic waves, electromagnetic waves, or the like to be transmitted, and receives information relating to received reflected waves. The outside-vehicle information detection unit 7400 may perform object detection processing or distance detection processing on a person, a car, an obstacle, a traffic sign, characters on a road surface, or the like on the basis of the received information. The outside-vehicle information detection unit 7400 may perform environment recognition processing for recognizing rainfall, fog, a road surface condition, or the like on the basis of the received information. The outside-vehicle information detection unit 7400 may calculate a distance to an object outside the vehicle on the basis of the received information.

Furthermore, the outside-vehicle information detection unit 7400 may perform image recognition processing or distance detection processing for recognizing a person, a car, an obstacle, a traffic sign, characters on a road surface, or the like on the basis of the received image data. The outside-vehicle information detection unit 7400 may perform processing such as distortion correction or alignment on the received image data and may combine pieces of image data captured by the imaging units 7410 different from each other so as to generate an overhead image or a panoramic image. The outside-vehicle information detection unit 7400 may perform viewpoint conversion processing using the image data captured by the imaging units 7410 different from each other.

The in-vehicle information detection unit 7500 detects in-vehicle information. A driver state detector 7510 that detects a state of a driver is connected, for example, to the in-vehicle information detection unit 7500. The driver state detector 7510 may include a camera that captures an image of the driver, a biosensor that detects biological information relating to the driver, a microphone that collects sound in the vehicle cabin, or the like. The biosensor is provided, for example, on a seat surface, a steering wheel, or the like, and detects biological information relating to a passenger who is seated on a seat or a driver who is holding the steering wheel. The in-vehicle information detection unit 7500 may calculate a fatigue degree or a concentration degree of the driver or may determine whether or not the driver is dozing on the basis of detection information input from the driver state detector 7510. The in-vehicle information detection unit 7500 may perform processing, such as noise canceling processing, on collected sound signal.

The integrated control unit 7600 controls the entire operation inside the vehicle control system 7000 in accordance with various programs. An input unit 7800 is connected to the integrated control unit 7600. The input unit 7800 is realized, for example, by an apparatus, such as a touch panel, a button, a microphone, a switch, or a lever, on which the passenger may perform an input operation. Data obtained by performing sound recognition on sound that has been input from the microphone may be input to the integrated control unit 7600. The input unit 7800 may be, for example, a remote controller that uses infrared rays or other radio waves, or external connection equipment, such as a portable telephone or a personal digital assistant (PDA), that corresponds to an operation performed on the vehicle control system 7000. The input unit 7800 may be, for example, a camera, and in this case, the passenger can input information by using a gesture. Alternatively, data obtained by detecting a movement of a wearable apparatus attached to the passenger may be input. Moreover, the input unit 7800 may include, for example, an input control circuit or the like that generates an input signal on the basis of the information described above that has been input by the passenger or the like by using the input unit 7800 and outputs the input signal to the integrated control unit 7600. The passenger or the like inputs various types of data to the vehicle control system 7000 or issues, to the vehicle control system 7000, an instruction relating to a processing operation, by operating this input unit 7800.

The storage 7690 may include a read only memory (ROM) that stores various programs executed by the microcomputer and a random access memory (RAM) that stores various parameters, arithmetic results, sensor values, or the like. Furthermore, the storage 7690 may be realized by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various pieces of equipment that are present in an external environment 7750. The general-purpose communication I/F 7620 may implement a cellular communication protocol such as global system of mobile communications (GSM), WiMAX, long term evolution (LTE), or LTE-advanced (LTE-A), or another wireless communication protocol such as a wireless LAN (also referred to as Wi-Fi (registered trademark)) or Bluetooth (registered trademark). The general-purpose communication I/F 7620 may perform connection to equipment (for example, an application server or a control server) that is present on an external network (for example, the Internet, a cloud network, or a company-specific network), for example, via a base station or an access point. Furthermore, the general-purpose communication I/F 7620 may perform connection to a terminal that is present near the vehicle (for example, a terminal of the driver, a pedestrian, or a store, or a machine type communication (MTC) terminal) by using, for example, a peer to peer (P2P) technology.

The dedicated communication I/F 7630 is a communication I/F that supports a communication protocol formulated for the purpose of use in a vehicle. The dedicated communication I/F 7630 may implement a standard protocol such as wireless access in vehicle environment (WAVE), which is a combination of IEEE 802.11p of a lower-order layer and IEEE 1609 of an upper-order layer, dedicated short range communications (DSRC), or a cellular communication protocol. The dedicated communication I/F 7630 typically performs V2X communication, which is a concept including one or more of vehicle to vehicle communication, vehicle to infrastructure communication, vehicle to home communication, and vehicle to pedestrian communication.

The positioning unit 7640 receives, for example, a global navigation satellite system (GNSS) signal from a GNSS satellite (for example, a global positioning system (GPS) signal from a GPS satellite), performs positioning, and generates position information including the latitude, longitude, and altitude of a vehicle. Note that the positioning unit 7640 may specify a current position by exchanging signals with a wireless access point, or may obtain the position information from a terminal, such as a portable telephone, a PHS, or a smartphone, that has a positioning function.

The beacon receiver 7650 receives radio waves or electromagnetic waves that have been transmitted from, for example, a wireless station that is provided on a road, or the like, and obtains information relating to a current position, a traffic jam, road closure, a required time, or the like. Note that a function of the beacon receiver 7650 may be included in the dedicated communication I/F 7630 described above.

The in-vehicle equipment I/F 7660 is a communication interface that mediates connection between the microcomputer 7610 and various pieces of in-vehicle equipment 7760 that are present in a vehicle. The in-vehicle equipment I/F 7660 may establish wireless connection by using a wireless communication protocol such as a wireless LAN, Bluetooth (registered trademark), near field communication (NFC), or wireless USB (WUSB). Furthermore, the in-vehicle equipment I/F 7660 may establish wired connection such as a universal serial bus (USB), a high-definition multimedia interface (HDMI), or a mobile high-definition link (MHL) via a not-illustrated connection terminal (and a cable if necessary). The in-vehicle equipment 7760 may include, for example, at least one of mobile equipment or wearable equipment that the passenger has or information equipment that is carried in or attached to the vehicle. Furthermore, the in-vehicle equipment 7760 may include a navigation apparatus that searches for a route to an arbitrary destination. The in-vehicle equipment I/F 7660 exchanges control signals or data signals with these pieces of in-vehicle equipment 7760.

The in-vehicle network I/F 7680 is an interface that mediates communication between the microcomputer 7610 and the communication network 7010. The in-vehicle network I/F 7680 transmits and receives a signal or the like in accordance with a prescribed protocol supported by the communication network 7010.

The microcomputer 7610 of the integrated control unit 7600 controls the vehicle control system 7000 in accordance with various programs on the basis of information that has been obtained via at least one of the general-purpose communication I/F 7620, the dedicated communication I/F 7630, the positioning unit 7640, the beacon receiver 7650, the in-vehicle equipment I/F 7660, or the in-vehicle network I/F 7680. For example, the microcomputer 7610 may calculate a control target value of the driving force generator, the steering mechanism, or the braking apparatus on the basis of obtained in-vehicle or outside-vehicle information, and may output a control command to the driving system control unit 7100. For example, the microcomputer 7610 may perform cooperative control aiming at implementing a function of an advanced driver assistance system (ADAS) including vehicle collision avoidance or impact mitigation, following traveling based on a distance between vehicles, vehicle speed maintaining traveling, vehicle collision warning, vehicle lane departure warning, or the like. Furthermore, the microcomputer 7610 may cooperative control aiming at automatic driving or the like for autonomously traveling independently of a driver's operation by controlling the driving force generator, the steering mechanism, the braking apparatus, or the like on the basis of obtained information relating to the periphery of the vehicle.

The microcomputer 7610 may generate three-dimensional distance information between the vehicle and a peripheral object such as a structure or a person on the basis of information obtained via at least one of the general-purpose communication I/F 7620, the dedicated communication I/F 7630, the positioning unit 7640, the beacon receiver 7650, the in-vehicle equipment I/F 7660, or the in-vehicle network I/F 7680, and may generate local map information including peripheral information of a current position of the vehicle. Furthermore, the microcomputer 7610 may predict danger such as vehicle collision, the approach of a pedestrian or the like, or entry to a closed road on the basis of the obtained information, and may generate a warning signal. The warning signal may be, for example, a signal that causes warning sound to be emitted or causes a warning lamp to glow.

The sound or image output unit 7670 transmits an output signal of at least one of sound or an image to an output apparatus that can visually or aurally report information to a passenger of a vehicle or the outside of the vehicle. In the example of FIG. 13, an audio speaker 7710, a display 7720, and an instrument panel 7730 are illustrated as the output apparatus. The display 7720 may include, for example, at least one of an on-board display or a head-up display. The display 7720 may have an augmented reality (AR) display function. The output apparatus may be an apparatus other than the apparatuses described above, e.g. a headphone, a wearable device such as an eyeglasses type display that is attached to a passenger, a projector, a lamp, or the like. In a case where the output apparatus is a display apparatus, the display apparatus visually displays a result obtained in various types of processing performed by the microcomputer 7610 or information received from another control unit in various forms such as text, an image, a table, or a graph. Furthermore, in a case where the output apparatus is a sound output apparatus, the sound output apparatus converts a reproduced audio signal including sound data, acoustic data, or the like into an analog signal, and aurally outputs the analog signal.

Note that, in the example illustrated in FIG. 14, at least two control units that are connected via the communication network 7010 may be integrated as a single control unit. Alternatively, an individual control unit may include a plurality of control units. Moreover, the vehicle control system 7000 may include another not-illustrated control unit. Furthermore, in the description above, another control unit may have some or all of the functions of any control unit. That is, prescribed arithmetic processing may be performed by any control unit if information is to be transmitted/received via the communication network 7010. Similarly, a sensor or an apparatus that is connected to any control unit may be connected to another control unit, and a plurality of control units may mutually transmit/receive detection information via the communication network 7010.

In the vehicle control system 7000 described above, the solid-state image sensor according to the present embodiment is applicable to the integrated control unit 7600 of the application example illustrated in FIG. 14.

Furthermore, at least some of the components of the solid-state image sensor according to the present embodiment may be realized in a module for the integrated control unit 7600 illustrated in FIG. 14 (for example, an integrated circuit module including a single die). Alternatively, the solid-state image sensor according to the present embodiment may be implemented by a plurality of control units of the vehicle control system 7000 illustrated in FIG. 14.

Note that embodiments according to the present technology are not limited to the embodiment described above, and various changes can be made without departing from the scope of the present technology.

The present technology can also employ the configuration described below.

(1)

An electronic substrate including:

an electronic chip that is placed above a substrate;

an electrode that exists between the substrate and the electronic chip and electrically connects the substrate and the electronic chip;

an underfill with which a space between the substrate and the electronic chip is filled so that the electrode is sealed and protected;

a protection target to be protected from inflow of the underfill, the protection target being formed on the substrate; and an underfill inflow prevention unit that is formed in the substrate so as to surround an entirety or a portion of the protection target.

(2)

The electronic substrate described in the above paragraph in which the underfill inflow prevention unit has a multiple structure.

(3)

The electronic substrate described in the above paragraph (1) or (2), in which the underfill inflow prevention unit is a recessed groove.

(4)

The electronic substrate described in the above paragraph (3), in which the recessed groove has an inclination angle of 60° to 90° with respect to a surface of the substrate.

(5)

The electronic substrate described in the above paragraph (3) or (4), in which a depth/width of the recessed groove ranges from 0.5 to 16000.

(6)

The electronic substrate described in the above paragraph (1) or (2), in which the underfill inflow prevention unit is a protruding wall.

(7)

The electronic substrate described in any one of the above paragraphs (1) to (6), in which the protection target is a connection pad that is connected to external equipment.

(8)

The electronic substrate described in any one of the above paragraphs (1) to (7), in which the protection target is a light-receiving layer, the electronic chip is a semiconductor chip including a functional circuit, and the electronic substrate is a component of a solid-state image sensor.

(9)

The electronic substrate described in any one of the above paragraphs (1) to (8), in which the underfill inflow prevention unit is formed in the substrate so as to surround all or some of one or a plurality of the protection targets.

(10)

The electronic substrate described in the above paragraph (8), in which a width of a flat portion provided between the underfill and the light-receiving layer ranges from $\lambda/8$ to $30\lambda$ with respect to a center wavelength $\lambda$ of incident light that enters the light-receiving layer.

(11)

The electronic substrate described in the above paragraph (10), in which the underfill inflow prevention unit includes a plurality of recessed groove portions, and an interval at which each of the plurality of recessed groove portions is a non-identical pitch.

(12)

The electronic substrate described in the above paragraph (11), in which an interval between the plurality of recessed groove portions ranges from $\lambda/8$ to $30\lambda$ with respect to the center wavelength $\lambda$ of the incident light that enters the light-receiving layer.

(13)

The electronic substrate described in the above paragraph (11) or (12), in which the plurality of recessed groove portions is formed to have widths different from each other.

(14)

The electronic substrate described in any one of the above paragraphs (11) to (13), in which a width of each of the plurality of recessed groove portions ranges from $\lambda/8$ to $30\lambda$ with respect to the center wavelength $\lambda$ of the incident light that enters the light-receiving layer.

(15)

An electronic apparatus in which an electronic substrate is employed, in which the electronic substrate includes:

an electronic chip that is placed above a substrate;

an electrode that exists between the substrate and the electronic chip and electrically connects the substrate and the electronic chip;

an underfill with which a space between the substrate and the electronic chip is filled so that the electrode is sealed and protected;

a protection target to be protected from inflow of the underfill, the protection target being formed on the substrate; and an underfill inflow prevention unit that is formed in the substrate so as to surround an entirety or a portion of the protection target.

REFERENCE SIGNS LIST

11 Substrate
12 Electrode
13 Electronic chip
14 Underfill
15 Groove
21 Optical layer
22 Connection pad
31 Substrate
32 Inflow prevention unit
33 Inflow prevention unit
41 Electrode
71 Substrate
72 Relay solder ball

The invention claimed is:

1. An electronic substrate, comprising:

an electronic chip on a substrate;

an electrode between the substrate and the electronic chip, wherein the electrode is configured to electrically connect the substrate and the electronic chip;
an underfill in a space between the substrate and the electronic chip to seal the electrode;
a protection target on the substrate; and
an underfill inflow prevention unit that comprises a plurality of recessed groove portions in the substrate, wherein
the plurality of recessed groove portions is between one side of the electronic chip and a portion of the protection target, and
an interval between a first adjacent pair of groove portions of the plurality of recessed groove portions on the one side of the electronic chip is different from an interval between a second adjacent pair of recessed groove portions of the plurality of recessed groove portions on the one side of the electronic chip.

2. The electronic substrate according to claim 1, wherein each of the plurality of recessed groove portions has an inclination angle of 60° to 90° with respect to a surface of the substrate.

3. The electronic substrate according to claim 1, wherein a ratio of a depth to a width of each of the plurality of recessed groove portions ranges from 0.5 to 16000.

4. The electronic substrate according to claim 1, wherein the protection target is a connection pad that is connected to external equipment.

5. The electronic substrate according to claim 1, wherein the protection target is a light-receiving layer,
the electronic chip is a semiconductor chip including a functional circuit, and
the electronic substrate is a component of a solid-state image sensor.

6. The electronic substrate according to claim 5, wherein a width of a flat portion between the underfill and the light-receiving layer ranges from λ/8 to 30λ with respect to a center wavelength A of incident light that enters the light-receiving layer.

7. The electronic substrate according to claim 6, wherein the interval between the plurality of recessed groove portions has a non-identical pitch.

8. The electronic substrate according to claim 7, wherein the interval between the plurality of recessed groove portions ranges from λ/8 to 30λ with respect to the center wavelength A of the incident light that enters the light-receiving layer.

9. The electronic substrate according to claim 7, wherein a width of a first recessed groove portion of the plurality of recessed groove portions is different from a width of a second recessed groove portion of the plurality of recessed groove portions.

10. The electronic substrate according to claim 7, wherein a width of each of the plurality of recessed groove portions ranges from λ/8 to 30λ with respect to the center wavelength A of the incident light that enters the light-receiving layer.

11. The electronic substrate according to claim 1, wherein the underfill inflow prevention unit surrounds a plurality of protection targets including the protection target.

12. The electronic substrate according to claim 1, wherein the interval between the plurality of recessed groove portions is decreased from the underfill to the protection target.

13. The electronic substrate according to claim 1, wherein the interval between the plurality of recessed groove portions is increased from the underfill to the protection target.

14. The electronic substrate according to claim 1, wherein an upper surface of the underfill is stacked with a black-color filter.

15. An electronic apparatus, comprising:
an electronic substrate that includes:
an electronic chip on a substrate;
an electrode between the substrate and the electronic chip, wherein the electrode is configured to electrically connect the substrate and the electronic chip;
an underfill in a space between the substrate and the electronic chip to seal the electrode;
a protection target on the substrate; and
an underfill inflow prevention unit that comprises a plurality of recessed groove portions in the substrate, wherein
the plurality of recessed groove portions is between one side of the electronic chip and a portion of the protection target, and
an interval between a first adjacent pair of groove portions of the plurality of recessed groove portions on the one side of the electronic chip is different from an interval between a second adjacent pair of recessed groove portions of the plurality of recessed groove portions on the one side of the electronic chip.

* * * * *